United States Patent [19]
Porter

[11] Patent Number: 5,123,457
[45] Date of Patent: Jun. 23, 1992

[54] MASS PIN ALIGNMENT TOOL
[75] Inventor: Warren W. Porter, Escondido, Calif.
[73] Assignee: NCR Corporation, Dayton, Ohio
[21] Appl. No.: 728,666
[22] Filed: Jul. 11, 1991
[51] Int. Cl.$^5$ ............................................... B21F 1/02
[52] U.S. Cl. .................................................. 140/147
[58] Field of Search ....................................... 140/147

[56] References Cited

U.S. PATENT DOCUMENTS

| | | | |
|---|---|---|---|
| 3,687,172 | 8/1972 | Suverkropp | 140/147 |
| 4,371,013 | 2/1983 | Camp | 140/147 |
| 4,397,341 | 8/1983 | Kent | 140/147 |
| 4,481,984 | 11/1984 | Linker | 140/147 |
| 4,544,003 | 10/1985 | Bumann et al. | 140/147 |
| 4,643,234 | 2/1987 | Alemanni | 140/147 |
| 4,789,011 | 12/1988 | Moloney | 140/147 |
| 4,824,632 | 4/1989 | Meuschke et al. | 376/261 |
| 4,895,189 | 1/1990 | Alemanni | 140/147 |
| 4,944,086 | 7/1990 | Nishihara et al. | 79/837 |

FOREIGN PATENT DOCUMENTS 127137  6/1987  Japan .

OTHER PUBLICATIONS

"Precision Pin Straightening Comb," by J. M. Cioffi, Jr. et al., IBM Technical Disclosure Bulletin, vol. 22, No. 3, Aug. 1972, p. 1102.

Primary Examiner—Lowell A. Larson
Attorney, Agent, or Firm—Gregory P. Gadson

[57] ABSTRACT

A simple, manual tool for re-aligning lead pins on a pin grid array (PGA) integrated circuit (IC) chip or the like. The tool has a series of removable, parallel bending plates mounted between a top and a base. The bending plates fit between the lead pins to be re-aligned. Re-alignment is accomplished by displacing the top relative to the base (which is stationary), which causes the bending plates to swivel from the base and impinge upon the lead pins at the upper ends of the bending plates. Permanent re-alignment is achieved by bending the lead pins past their elastic limit to a desired point. The top remains parallel to the base at all times. Maximum displacement of the bending plates is limited by an outer skirt when it contacts the base. Four springs bias the tool toward the neutral position. After the lead pins are re-aligned in one direction, the PGA is removed, rotated 90 degrees, and the re-inserted, whereupon the re-alignment routine is performed again to complete the re-alignment process. An adapter plate mounted on the top of the tool accepts PGAs of different sizes.

10 Claims, 7 Drawing Sheets

MASS PIN ALIGNMENT TOOL

FIELD OF THE INVENTION

The present invention generally relates to correcting unwanted physical eccentricities in electronic components. More particularly, the present invention relates to the re-alignment of the lead pins in pin grid array (PGA) integrated circuit (IC) chips for ease of mounting in PGA sockets.

BACKGROUND OF THE INVENTION

It has been observed that a direct relationship often exist between chip operating speeds and chip density. Thus, as the chip operating speeds increases, so does the density, which necessitates placing a greater number of input/output (lead) pins in closer proximity. To meet the increased density requirement, lead pins are being made with smaller shaft diameters, making them more vulnerable to deformation and misalignment. Components with misaligned lead pins cannot be feasibly inserted into the appropriate holes in mating sockets.

Prior art tools for pin re-alignment are expensive, bulky, time consuming to operate, and not easily adaptable to PGAs (and other IC packages) of different sizes. Hence, the present invention is an improvement over prior art pin re-alignment tools.

SUMMARY OF THE INVENTION

It is an object of the present invention to provide a pin re-alignment tool which has a simple configuration.

It is also an object of the present invention to provide a pin re-alignment tool which is simple to operate.

It is another object of the present invention to provide a pin re-alignment tool which is adaptable to re-align lead pins of electronic components of different dimensions.

It is a further object of the present invention to provide a pin re-alignment tool which is portable.

It is still a further object of the present invention to provide a pin re-alignment tool which is inexpensive.

There is provided in accordance with the present invention, a pin alignment apparatus for aligning lead pins on an electronic component. The apparatus includes:

mounting means for mounting the electronic component;

a top for carrying the mounting means;

a base substantially parallel to the top at all times; and a plurality of substantially parallel pin-bending plates having a first edge for positioning between lead pins to be aligned, and a second edge serving as a fixed pivot end coupled to the base, the plates being substantially parallel relative to each other at all times;

wherein the top is moved relative to the base to pivotally displace the plates at the first edges, so that the first edges impinge upon the lead pins until the lead pins are aligned.

The details of the present invention will be revealed in the following description with reference to the drawing figures.

DESCRIPTION OF THE PREFERRED EMBODIMENT

Figure 1:
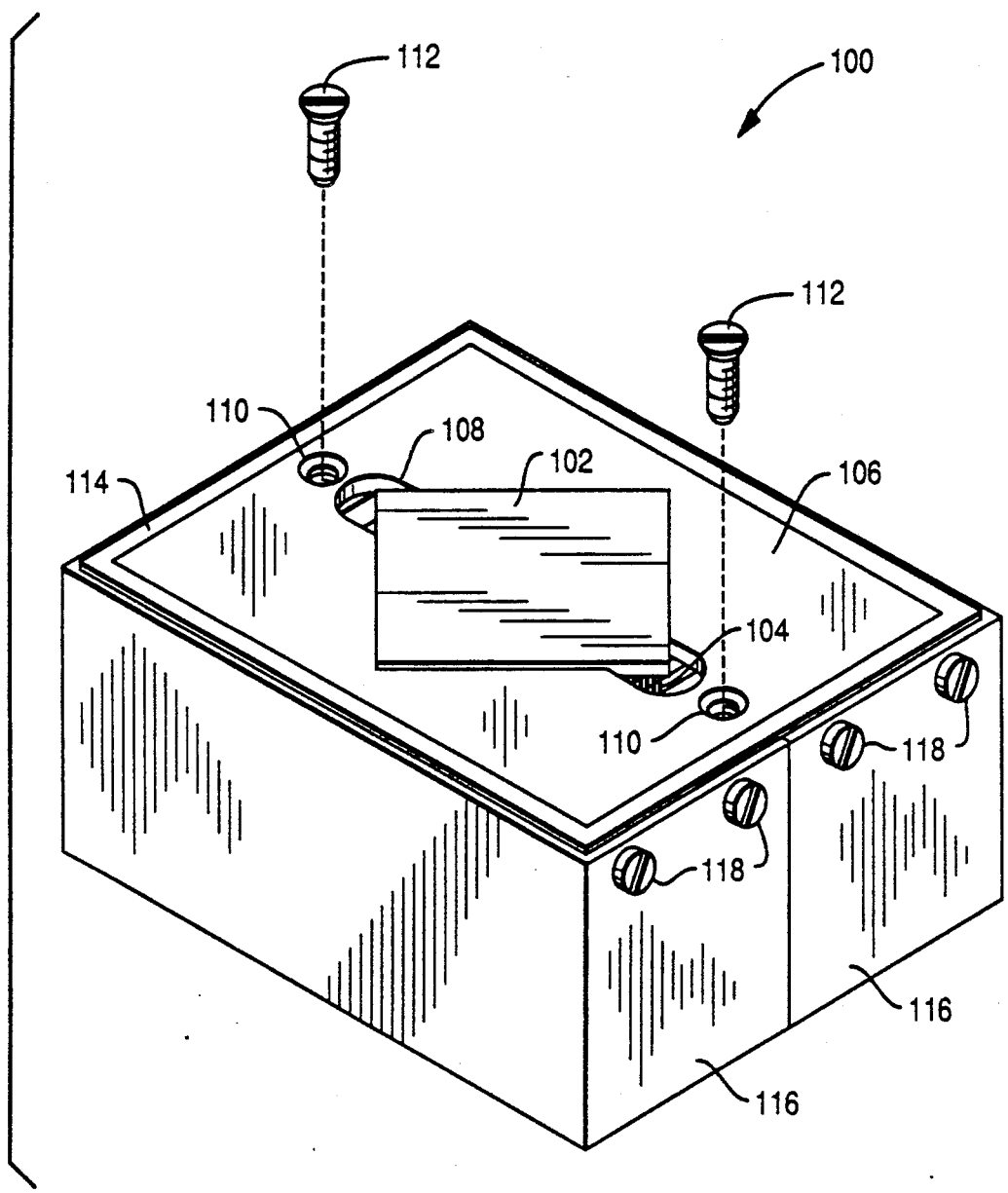
FIG. 1 is an isometric view of the pin alignment apparatus of the present invention.
Figure 2:
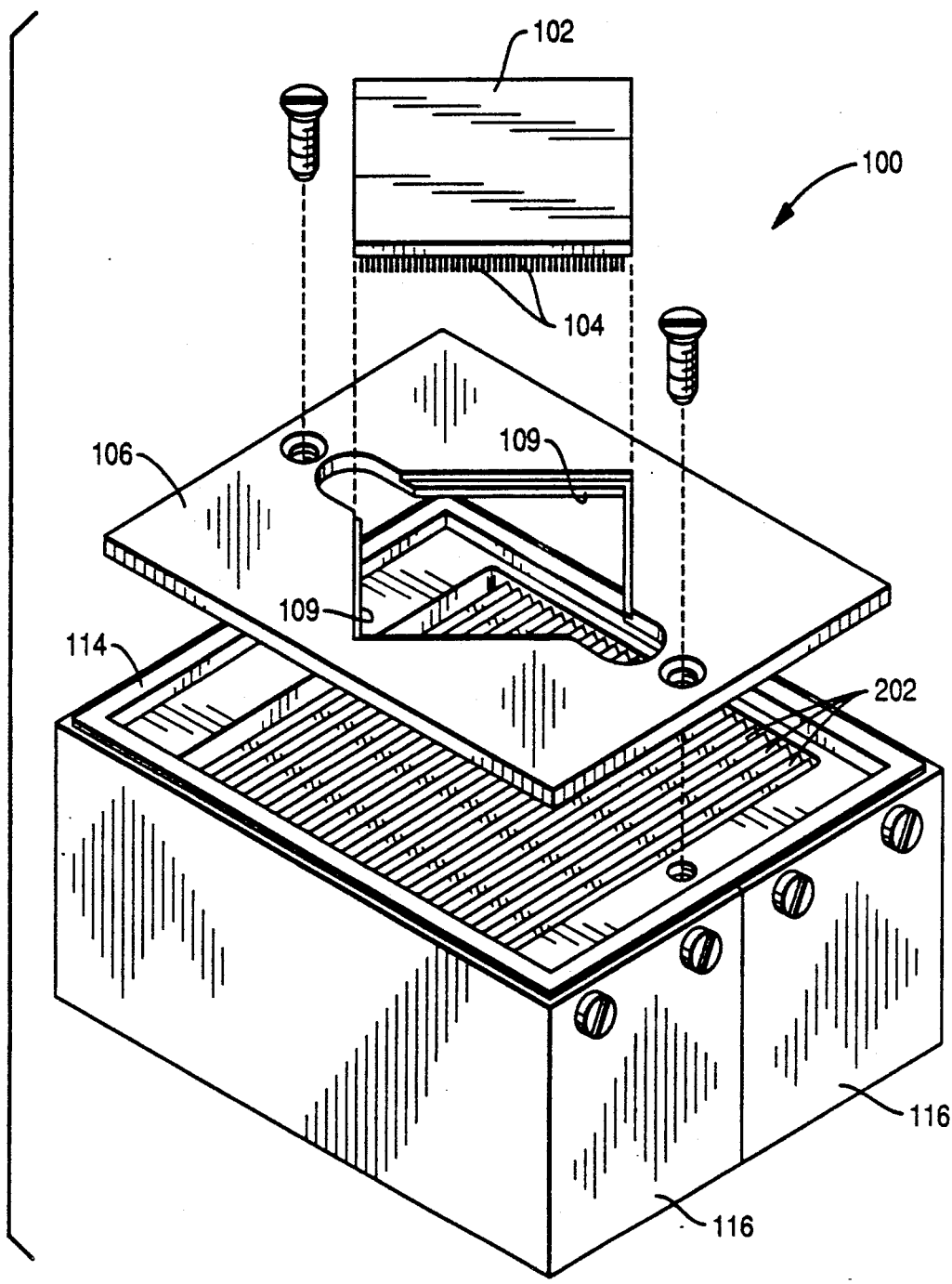
FIG. 2 is an isometric view of the pin alignment apparatus in FIG. 1 with its adapter plate removed.

FIG. 1 shows a mass pin alignment tool or pin alignment apparatus 100 for re-aligning lead pins 104 of a PGA chip 102. An adapter plate or mounting means 106 has a cutout 108 with an area matching the contour projected by the lead pins 104. The PGA chip 102 is mounted on the adapter plate 106 by inserting its lead pins 104 in the cutout 108 until the outer ledges of the PGA chip 102 rest on four cutout ledges 109 (as seen in FIG. 2), which have a 0.025 inch by 0.025 inch cross-section in the preferred embodiment. The two oval-shaped regions of the cutout 108 provide clearance for a thumb and finger to grasp the PGA chip 102 for removal when desired.

The mass pin alignment tool 100 has a top 114 to which the adapter plate 106 is mounted and secured by two screws 112 via holes 110. A variety of adapter plates 106 can be used, each having different cutout contours to accept PGA chips of different dimensions.

Two skirts or stop means 116 which are fastened to the top 114 with screws 118 serve as displacement limiters during the pin re-alignment process, as will be more fully detailed infra.

Figure 3:
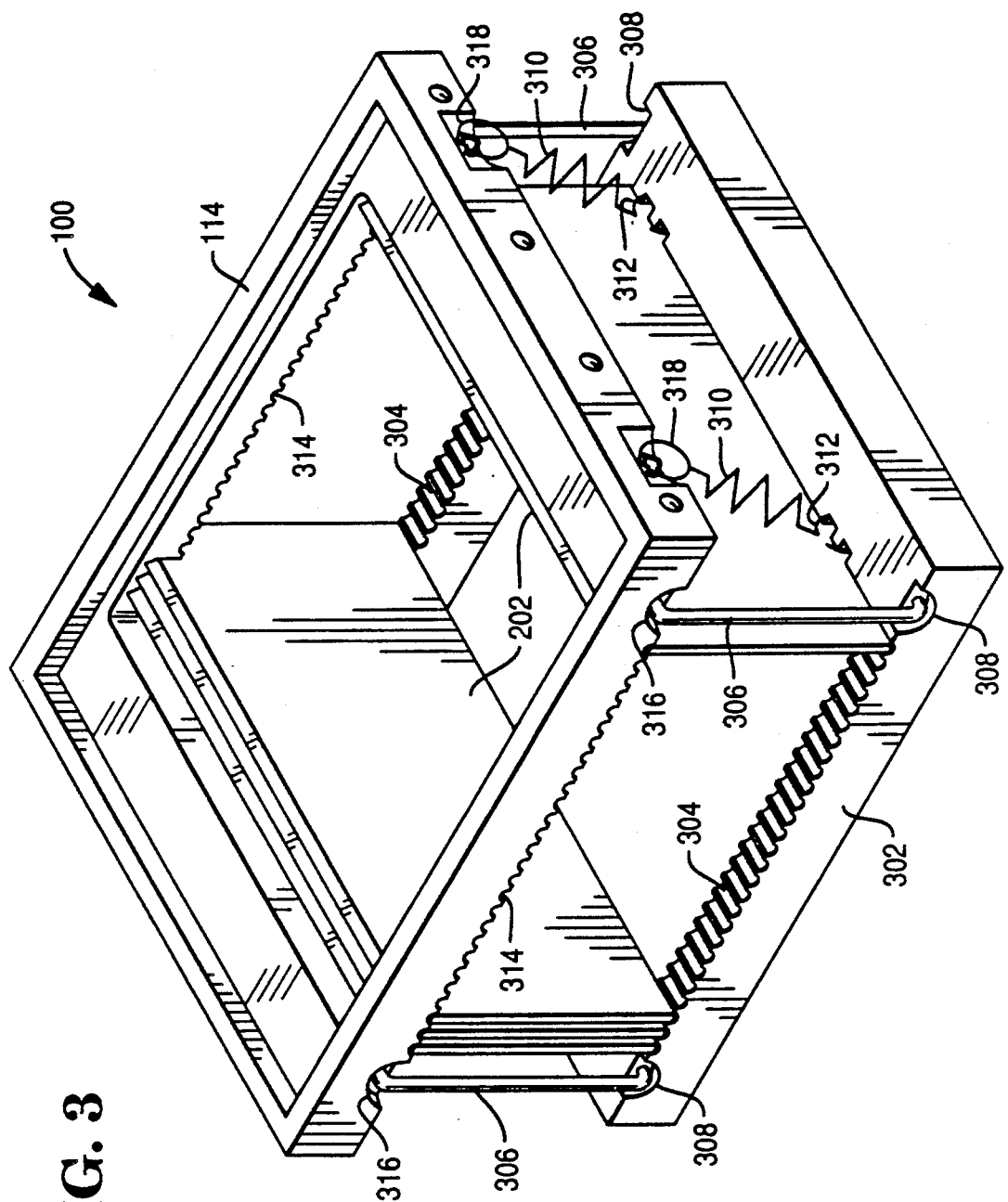
FIG. 3 is an isometric view of the pin alignment apparatus in FIG. 1 with its adapter plate and skirts removed.

FIG. 2 shows the mass pin alignment tool 100 with its adapter plate 106 removed to reveal a group of parallel pin-bending plates or bending plates 202. Details of the bending plates 202 can be better seen in FIGS. 4 and 5. In the preferred embodiment the bending plates are spaced 0.0707 inches apart (see FIG. 8). FIG. 3, with its adapter plate 106 and skirts 116 removed, reveals more internal details of the mass pin alignment tool 100. A base 302 has two sets of semicylindrical grooves 304 for supporting the bending plates 202. The base 302 and the top 114 are connected by four pivotal retainer arms 306 at pivot holes 308 in the base and holes 316 in the top. The connection of the pivotal retainer arms 306 to the top 114 and the base 302 maintains a parallel orientation of the top and base when the top is moved relative to the base. Two bias return springs or bias return means 310 connected at points 312 (base) and 318 (top) tend to return the top 114 to a neutral position following a horizontal displacement of top during the re-alignment process.

Figure 4:
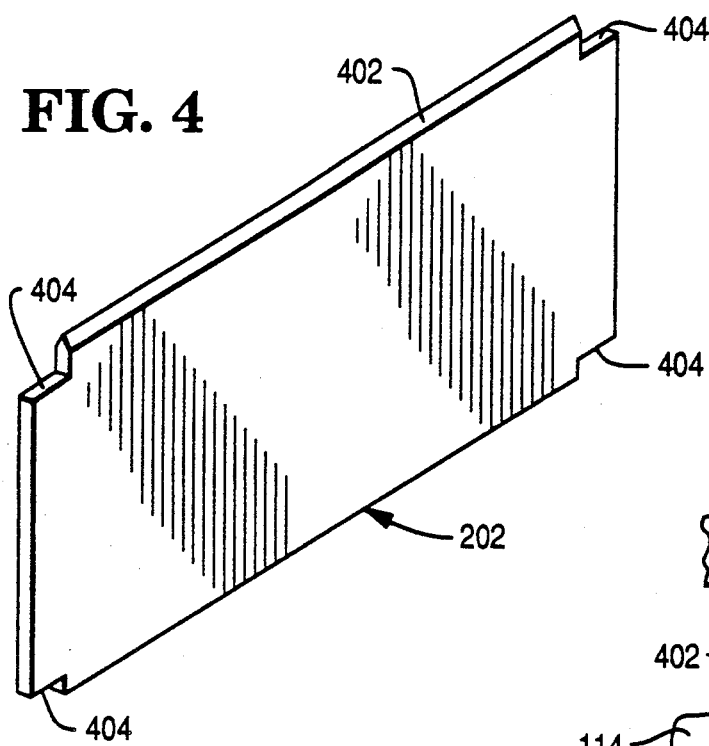
FIG. 4 is an isometric view of a bending plate of the pin alignment apparatus of the present invention.
Figure 5:
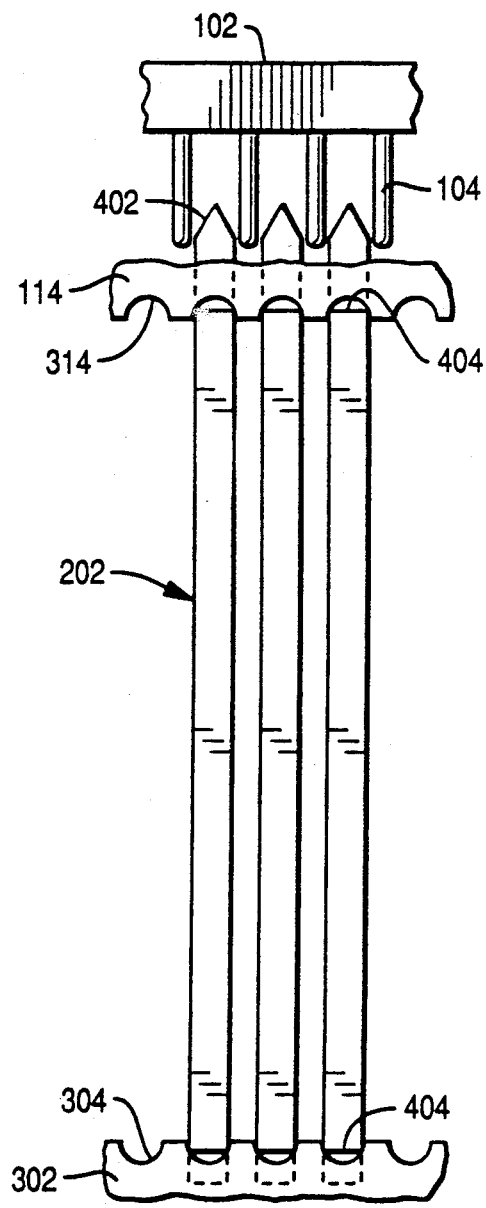
FIG. 5 is a partial side view of a group of bending plates mounted between the base and top portions of the pin alignment apparatus with its skirts removed, and positioned between PGA lead pins to be re-aligned.

From FIGS. 4 and 5, it can be seen that the bending plate 202 has four notches or square cutouts 404 which are designed to rest in the semicylindrical grooves 304 and 314. The semicylindrical grooves 304 and 314 allow the bending plates 202 to swivel while still maintaining contact between the top 114 and base 302. The top edge 402 of the bending plate 202 is angled so as to guide bent lead pins into the space between the bending plates 202 as the PGA chip 102 is lowered into place.

Figure 6:
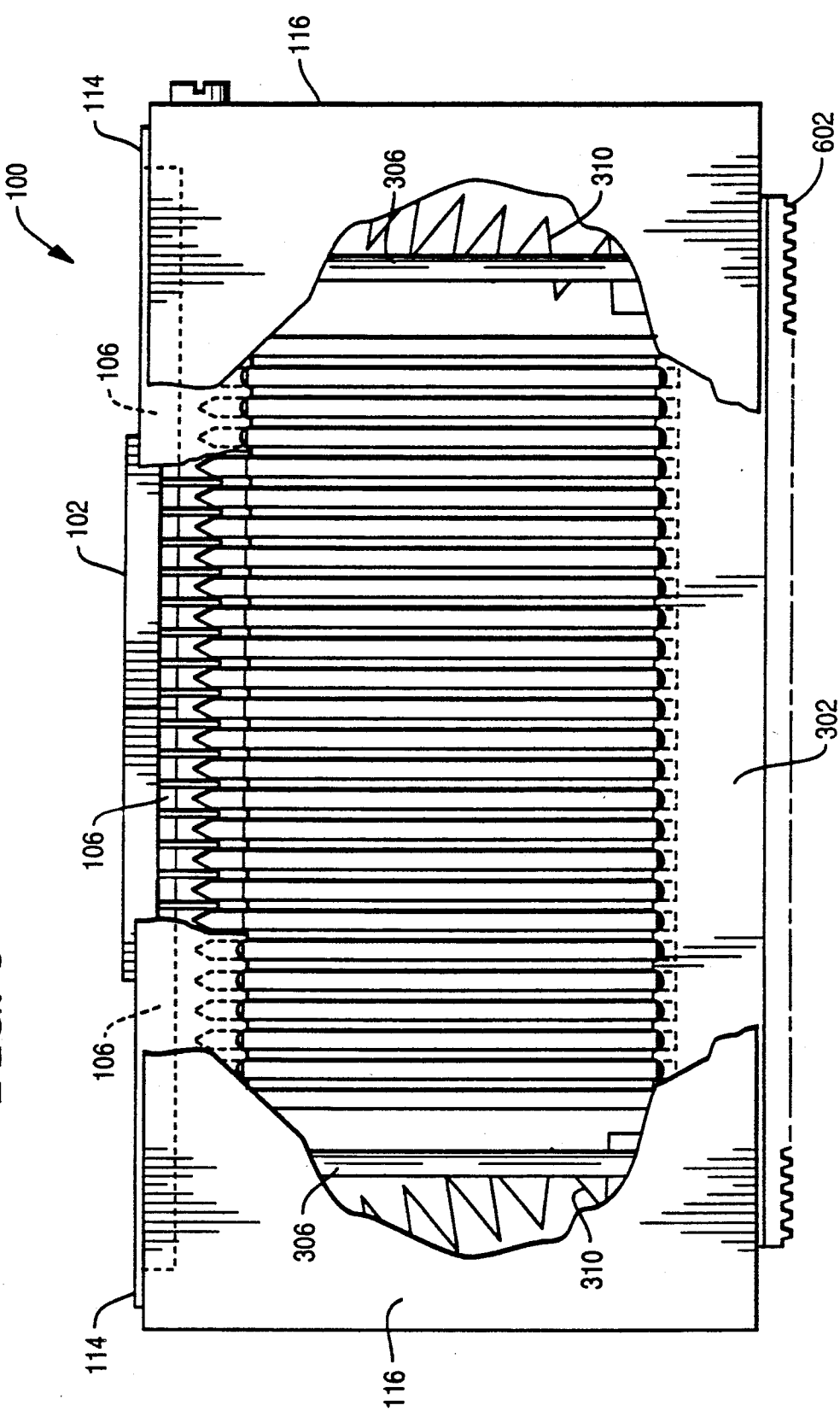
FIG. 6 is a side view of the pin alignment apparatus of the present invention with its skirts removed.

FIG. 6 is a side view of the mass pin alignment tool 100 with a PGA chip 102 inserted for re-alignment of its lead pins. Note that the mass pin alignment tool 100 is in neutral position, with the top 114 being approximately centered over the base 302. The base has an elastometric pad 602 attached to its underside to provide traction between the base and a supporting surface and prevent sliding of the mass pin alignment tool 100 during the re-alignment process.

Figure 7:
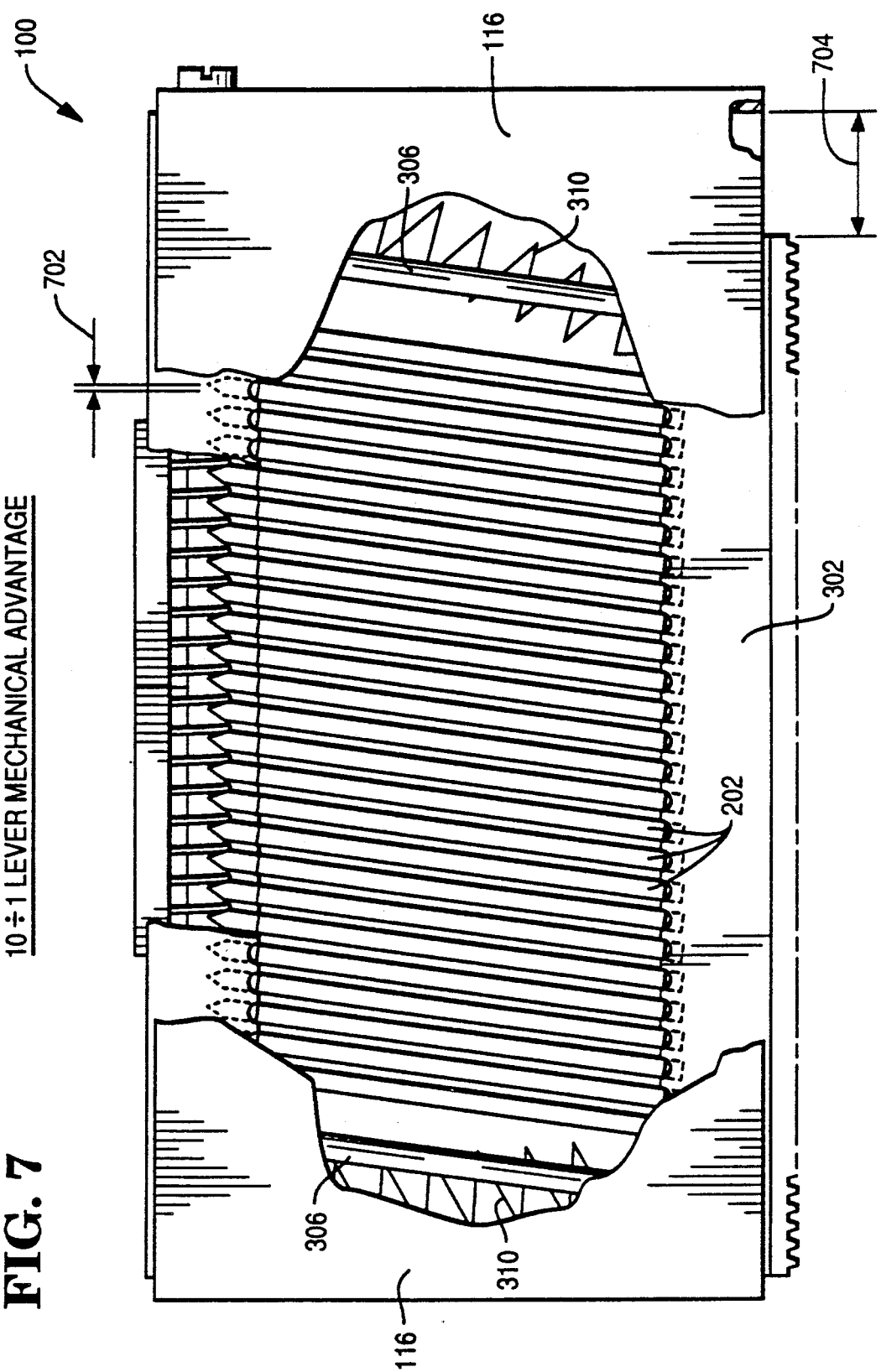
FIG. 7 is a side view of the pin alignment apparatus of the present invention with its skirts removed, and showing extreme displacement of the top with respect to the base in a rightward direction.

In FIG. 7, the mass pin alignment tool 100 is shown with the top 114 and hence the top edges of the bending plates 202 fully displaced to the right. All displacements of the top 114 are manually made by grasping it, and then pushing and pulling it in the desired direction. A maximum displacement of 0.2 inches occurs when vertical edges of the skirts 116 touch a vertical edge of the base 302. The bias return spring 310 on the right hand side of the Figure elongates and develops a spring force which will tend to pull the top 114 back to the neutral position shown in FIG. 6. This orientation is used to bend lead pins to the right. The maximum displacement of the bending plate top edges 402 is 0.02 inches. It should be noted, however, that the amount of bending needed for re-alignment of lead pins is normally less than the maximum allowable bending. The displacement of the top 114 is considerably larger than the actual pin displacement. This provides a mechanical advantage which improves tactility and pin displacement control.

Figure 8:
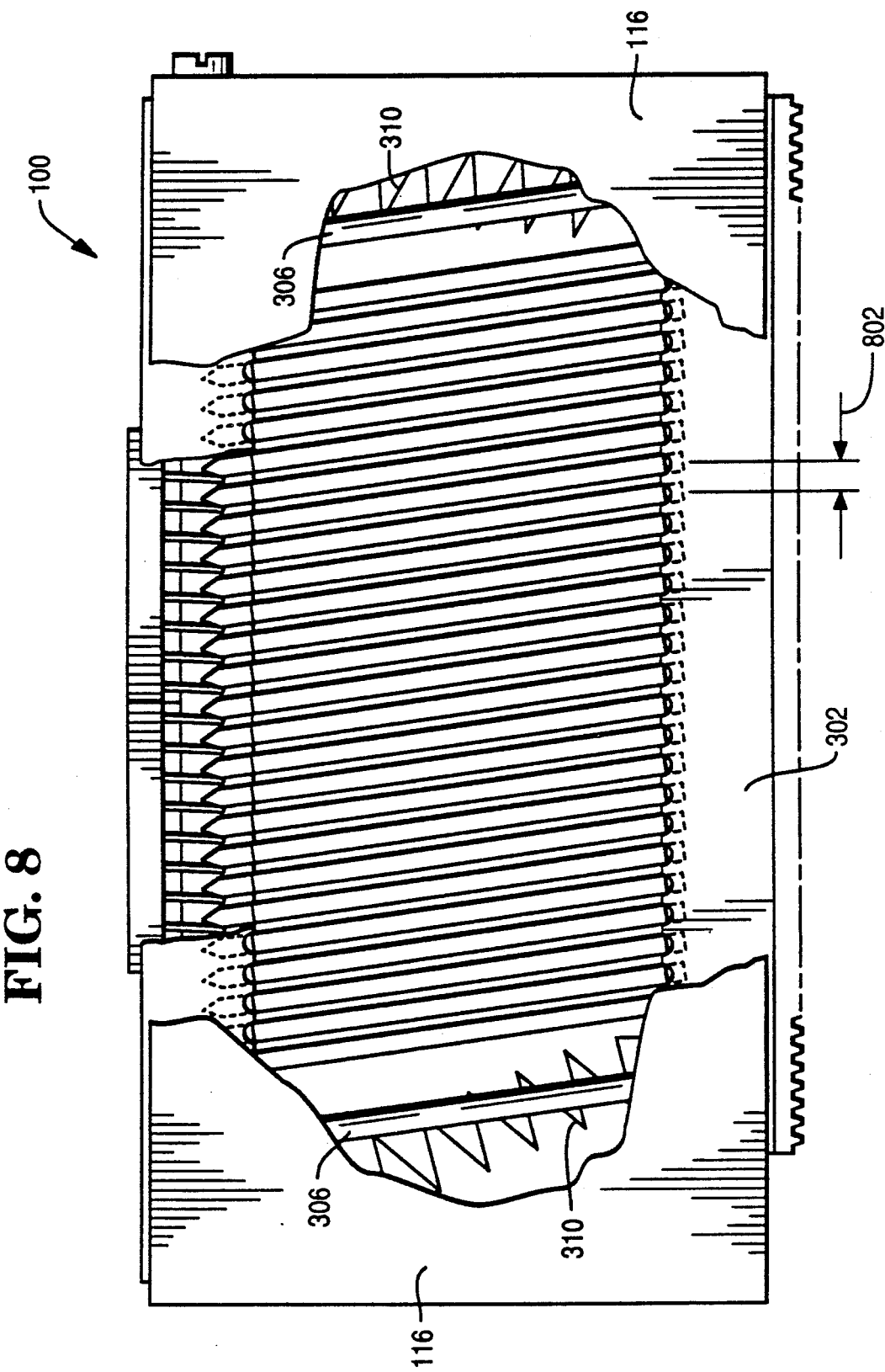
FIG. 8 is a side view of the pin alignment apparatus of the present invention with its skirts removed, and showing extreme displacement of the top with respect to the base in a leftward direction.

FIG. 8 is the same as FIG. 7, except that the displacement is to the left rather than to the right. The left bias return spring 310 becomes elongated in this instance, and will return the top 114 to the neutral position when the user releases it.

In order to introduce permanent corrections to bent pins, the lead pins must be bent past their elastic limits. The lead pins are visually inspected to determine if they are substantially or adequately aligned. The alignment process is repeated, as necessary.

For complete re-alignment of lead pins, it may be necessary to: first, re-align the lead pins along a first axis; second, remove and rotate the PGA chip 90 degrees from its original orientation; third, re-insert the PGA chip; and fourth re-align the lead pins along a second axis (which is perpendicular to the first axis).

It should be noted that in the present invention, the components are designed to wear evenly, so that no misalignment within the apparatus 100 develops during its lifetime.

Variations and modifications to the present invention are possible given the above disclosure. However, such variations and modifications are intended to be within the scope of the invention claimed by this letters patent. For example, the present invention is not limited to use with PGA ICs, and can be modified to be used with other types of packaging schemes and components where pin alignment or re-alignment is required.

I claim:

1. A pin alignment apparatus for aligning lead pins of an electronic component comprising:
    mounting means for mounting said electronic component;
    a top for carrying said mounting means;
    a base substantially parallel to said top at all times; and
    a plurality of substantially parallel pin-bending plates having a first edge for positioning between lead pins to be aligned, and a second edge serving as a fixed pivot end coupled to said base, said plates being substantially parallel relative to each other at all times;
    wherein said top is moved relative to said base to pivotally displace said plates at said first edges, so that said first edges impinge upon said lead pins until the lead pins are aligned.

2. The pin alignment apparatus in claim 1 wherein the first edges of said plates are beveled.

3. The pin alignment apparatus in claim 1 further comprising:
    a stop means for stopping the movement of said top relative to said base when a defined maximum displacement is reached.

4. The pin alignment apparatus in claim 3 further comprising:
    bias return means for returning said top to a neutral position after displacement.

5. The pin alignment apparatus in claim 1 further comprising:
    bias return means for returning said top to a neutral position after displacement.

6. The pin alignment apparatus in claim 1 wherein the first edges of said plates are beveled.

7. A pin alignment apparatus for aligning lead pins of an electronic component, comprising:
    (a) a base;
    (b) a plurality of pin-bending plates, each having a pivot end and a free end, wherein each said pivot end is pivotally mounted relative to said base, and said pin-bending plates remain substantially parallel to one another at all times; and
    (c) a mounting means for mounting the electronic component relative to said pin-bending plates in such a manner that the lead pins are positioned between free ends of adjacent pin-bending plates, whereby lateral movement of the mounted electronic component relative to said base pivots the pin-bending plates and aligns the lead pins.

8. The pin alignment apparatus in claim 7 wherein each said free end is beveled.

9. The pin alignment apparatus in claim 7 further comprising:
    a stop means for stopping lateral movement of the mounted electronic component relative to said base when a defined maximum displacement is reached.

10. The pin alignment apparatus in claim 7 further comprising:
    bias return means for returning said pin-bending plates to a neutral position after displacement.

* * * * *